US012802775B2

(12) United States Patent
Zlotnik et al.

(10) Patent No.: US 12,802,775 B2
(45) Date of Patent: *Nov. 17, 2026

(54) SCAN-BASED VOLTAGE FREQUENCY SCALING

(71) Applicant: Micron Technology, Inc., Boise, ID (US)

(72) Inventors: Leon Zlotnik, Camino, CA (US); Leonid Minz, Beer Sheva (IL); Yoav Weinberg, North York (CA)

(73) Assignee: Micron Technology, Inc., Boise, ID (US)

( * ) Notice: Subject to any disclaimer, the term of this patent is extended or adjusted under 35 U.S.C. 154(b) by 142 days.

This patent is subject to a terminal disclaimer.

(21) Appl. No.: 18/975,645

(22) Filed: Dec. 10, 2024

(65) Prior Publication Data

US 2025/0104794 A1 Mar. 27, 2025

Related U.S. Application Data

(63) Continuation of application No. 17/692,262, filed on Mar. 11, 2022, now Pat. No. 12,170,124.

(51) Int. Cl.
*G11C 29/50* (2006.01)
*G11C 29/02* (2006.01)

(52) U.S. Cl.
CPC ...... *G11C 29/50004* (2013.01); *G11C 29/028* (2013.01)

(58) Field of Classification Search
CPC ............ G11C 29/50004; G11C 29/028; G11C 29/021; G11C 29/023; G11C 29/52; G11C 29/10; G11C 29/12; G11C 29/14; G11C 29/50; G11C 29/5004; G11C 2207/2254; G11C 7/04; G06F 1/3296
See application file for complete search history.

(56) References Cited

U.S. PATENT DOCUMENTS

| | | | |
|---|---|---|---|
| 3,430,070 | A | 2/1969 | Marshall, Jr. et al. |
| 5,179,295 | A | 1/1993 | Mattison et al. |
| 5,767,717 | A | 6/1998 | Schorn et al. |
| 9,599,672 | B2 | 3/2017 | Abhishek et al. |
| 10,579,131 | B2 | 3/2020 | Kim et al. |
| 10,990,473 | B2 | 4/2021 | Lee et al. |
| 2006/0294282 | A1 | 12/2006 | Warner |
| 2010/0332924 | A1 | 12/2010 | Ziaja |
| 2014/0317427 | A1 | 10/2014 | Hill |
| 2016/0225436 | A1 | 8/2016 | Wang et al. |

(Continued)

*Primary Examiner* — Mark D Featherstone
*Assistant Examiner* — Rong Tang
(74) *Attorney, Agent, or Firm* — Brooks, Cameron & Huebsch, PLLC

(57) ABSTRACT

An example method for scan-based voltage frequency scaling can include performing a plurality of at-speed scan operation on a system on chip (SoC) at a plurality of respective voltage values. The example method can include entering data gathered from at least one of the plurality of at-speed scan operations into a database. The entered data is associated with the respective plurality of voltage value. The example method can include determining a particular voltage value of the respective plurality of voltage values at which a parameter of the SoC reaches a threshold. The example method can include indicating the determined particular voltage in the database. The indicated determined particular voltage in the database can be used for performing one or more operations using the SoC.

20 Claims, 5 Drawing Sheets

(56) References Cited

U.S. PATENT DOCUMENTS

| | | | |
|---|---|---|---|
| 2018/0052506 | A1 | 2/2018 | Kuo et al. |
| 2021/0141407 | A1 | 5/2021 | Lai et al. |
| 2022/0011795 | A1 | 1/2022 | Rifani |

SCAN-BASED VOLTAGE FREQUENCY SCALING

PRIORITY INFORMATION

This application is a Continuation of U.S. application Ser. No. 17/692,262, filed Mar. 11, 2022, which issues as U.S. Pat. No. 12,170,124 on Dec. 17, 2024, the contents of which are included herein by reference.

TECHNICAL FIELD

Embodiments of the disclosure relate generally to memory sub-systems, and more specifically, relate to scan-based voltage frequency scaling.

BACKGROUND

A memory system can include digital logic and an associated power supply, voltage control, and clock control. In general, the power supply, voltage control, and/or clock control can change a voltage or frequency during operation of the digital logic.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
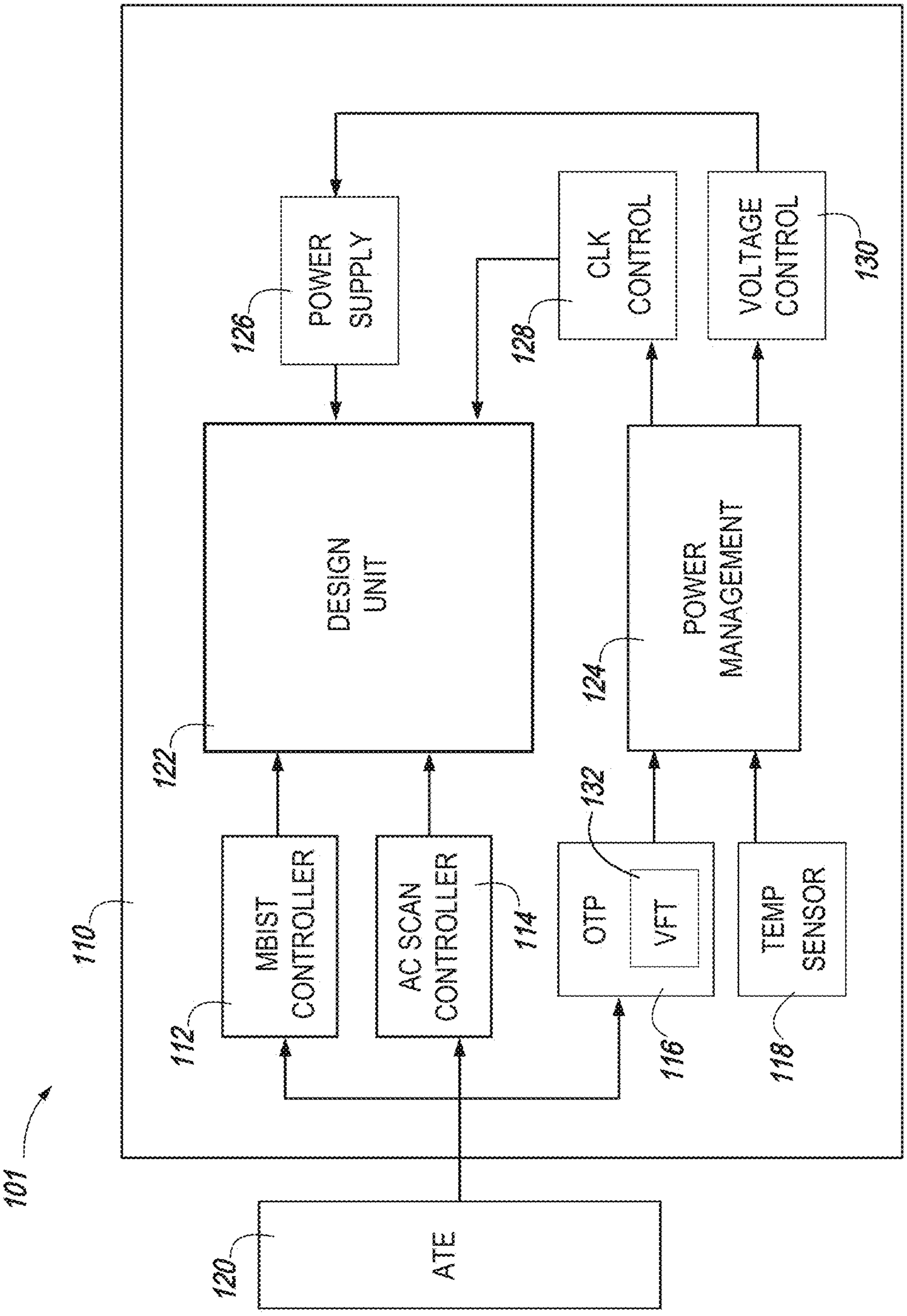
FIG. 1 illustrates an example system for scan-based voltage frequency scaling in accordance with some embodiments of the present disclosure.

Aspects of the present disclosure are directed to scan-based voltage frequency scaling. Voltage and frequency scaling (VFS) can be used to match system power consumption with desired performance. Workloads associated with a system (e.g., a computing system) can be monitored to determine a setting for voltage and clock speed and can configure the hardware of the system appropriately. Dynamic voltage and frequency scaling (DVFS) is a technique that aims at reducing the dynamic power consumption of a system by dynamically adjusting voltage and frequency of the system. This can exploit the fact that the system generally has a discrete frequency and voltage setting. Dynamic voltage scaling to increase voltage can be referred to as overvolting, whereas dynamic voltage scaling to decrease voltage can be referred to as undervolting. Undervolting can be performed in order to conserve power, particularly in laptops and other mobile devices, where energy comes from a battery and thus is limited, or, in rare cases, to increase reliability. Overvolting can be performed in order to support higher frequencies for performance. The term "overvolting" may also be used to refer to increasing static operating voltage of memory components to allow operation at higher speed (e.g., while overclocking).

The voltage and frequency applied to various components of the systems described herein can be dynamically adjusted based on voltage and frequency data (in addition to other parameters, if monitored) that is gathered during an AC (or at-speed) scan. The voltage and frequency data of the AC scan can gather real-time data for a large portion of the system and provide a more accurate in real-time approach to adjusting the voltage and frequency for scaling. Accordingly, voltage frequency scaling can provide benefits in systems (e.g., application-specific integrated circuits (ASICs), field-programmable gate arrays (FPGAs), automated power management systems, etc.) that rely on instantaneous (or near-instantaneous) changes to the voltage, frequency, and temperature of the system where each parameter may affect one of the other parameters.

In addition, the voltage and frequency can affect an error rate of the data in the system. For example, decreasing the voltage of the system and/or increasing the frequency of the system can increase errors. Vice versa, increasing the voltage and/or decreasing the frequency can decrease, or minimize, an error rate of the data in the system. In this way, using the real-time data of an AC scan to determine the voltage and frequency correlations on error rates can provide a more accurate and comprehensive approach to understanding the effects of the parameters on error rate. Examples of voltage frequency scaling and the components that can be utilized to facilitate embodiments of the present disclosure are described below in conjunction with FIG. 1, et alibi.

In some previous approaches, a process-based approach to voltage frequency scaling can be based on a theoretical simulation of voltages and frequencies and the data based on these theoretical simulations can be stored in a look-up table. However, these previous approaches are generally limited by large margins of error due to the data being based on simulation and not on real-time data. Further, the accuracy of the margin of error may not even be able to be calculated or known in such approaches. Further, in some previous approaches, a monitor-based voltage frequency scaling may use a feedback loop involving a power controller that can indicate how fast or slow a device is actually running based on power-voltage-temperature (PVT) characteristics. However, these and other such monitor-based approaches are often connected to a limited number of cells and may not represent a large enough portion of the system to be accurate and/or beneficial.

In contrast to these previous approaches, methods and systems as described herein seek to cure the deficiencies of the previous approaches and avoid such problems by using the AC scan (e.g., an at-speed scan) to get a more accurate and real-time profile for a system (e.g., a memory chip). Information collected from a plurality of at-speed (AC) scan operations can be used to fill in a database (e.g., table) with voltage, frequency, temperature, and/or other data that can be correlated to error rate and/or error quantity data in order to scale up or down each of the voltage or frequency of the system.

FIG. 1 illustrates an example system 101 for scan-based voltage frequency scaling in accordance with some embodiments of the present disclosure. The system 101 can include an automatic testing equipment (ATE) component 120 and a system on chip (SoC) 110. A component, such as the ATE component 120 described herein, can include various circuitry to facilitate an operation associated with the component, e.g., testing a portion of an SoC (such as SoC 110). For example, the ATE component 120 can include special purpose circuitry in the form of an ASIC, FPGA, state machine, and/or other logic circuitry or software and/or firmware that can allow the ATE component 120 to test other components and/or parameters of the SoC 110. As an example, the ATE component 120 can be a simple computer-controlled digital multimeter, or a complicated system containing dozens or more complex test instruments (real or simulated electronic test equipment) capable of automatically testing and diagnosing faults in sophisticated electronic packaged parts or on wafer testing, including systems on chips and/or integrated circuits.

Further, the SoC 110 can be an application-specific-integrated circuit (ASIC), a field-programmable gate array (FPGA), etc. The SoC 110 includes a design unit 122 and a power management controller 124. The power management controller 124 can apply dynamic voltage frequency scaling (DVFS) operations using the one-time programmable (OTP) memory 116, the temperature sensor 118, and any other available inputs, as will be described below. The design unit 122 includes circuitry which can include one or more cores (e.g., "intellectual property (IP) cores"). As used herein, a "core" or "IP core" generally refers to one or more blocks of data and/or logic that form constituent components of an application-specific integrated circuit or field-programmable gate array. In some examples, the power management controller 124 can be a power management integrated circuit (or PMIC) used for managing power of the system 101. Although PMIC can refer to a wide range of chips (or modules in system on a chip (SoC) devices), most include several DC/DC converters. A DC-to-DC converter is an electronic circuit or electromechanical device that converts a source of direct current (DC) from one voltage level to another. It is a type of electric power converter. A PMIC is often included in battery-operated devices such as mobile phones and portable media players to decrease the amount of space required.

The design unit 122 communicates with the ATE component 120 through an MBIST ("memory built-in self-test") controller 112 and/or an AC scan controller 114. While an MBIST controller 112 is being described herein, embodiments are not so limited. For example, MBIST is just an example self-test and any number of self-test circuits can be used. The AC scan controller 114 can refer to circuitry and/or control logic that is used to control and manage an AC scan, as will be described further below. MBIST can refer to the industry-standard method of testing embedded memories. MBIST operates by performing sequences of reads and writes to the memory according to a test algorithm. Many industry-standard test algorithms exist. An MBIST controller generates the correct sequence of reads and writes to all locations of the memory (e.g., such as a random access memory (RAM)) to ensure that the cells are operating correctly. In doing this, some additional test coverage is achieved in the address and data paths that the MBIST uses. In addition, the design unit 122 can communicate with the power management controller 124 through a clock ("CLK") control component 128 and a voltage control component 130 that is in communication with a power supply 126 and communicates through the power supply 126 to the design unit 122. The voltage control component 130 can control the voltage of the power supply 126 according to instructions received from the power management controller 124. In some examples, the power management controller 124 can be a power management integrated circuitry (PMIC).

The clock control component 128 can include various circuitries and/or logic inserted on the SOC 110 for controlling clocks during silicon testing on the ATE component 120. The clock control component 128 can scale a clock timing according to instructions received from the power management controller 124. Further, since AC (at-speed) testing generally requires two or more clock pulses in capture mode with a frequency equal or substantially close to the functional clock frequency, without the clock control component 128, the at-speed pulses related to the ATE 120 may need to be provided through the input/output (I/O) pads of the system 110. However, these I/O pads can have limitations in terms of the maximum frequency they can support. The clock control component 128, on the other hand, can use, in some examples, an internal phase-lock-loop (PLL) clock for generating clock pulses for test and/or, in other examples, an internal delay-locked-loop (DLL) clock for generating the clock pulses for test. While the clock control component 128 is described as providing clock timing for the ATE component 120 and also the clock timing according to instructions received from the power management controller 124, embodiments are not so limited. For example, the clock control component 128 can be used for scaling the frequency according to instructions from the power management controller 124 to dynamically adjust the frequency for DVF scaling and a different clock control component (not illustrated) can be used solely for the ATE component 120 and for clock timing of the ATE testing itself.

In some examples, the PLL clock can refer to circuitry and/or logic that generates an output signal whose phase is related to the phase of an input signal. Although there are several different types of PLL clock circuits, the simplest is an electronic circuit consisting of a variable frequency oscillator and a phase detector in a feedback loop. The oscillator generates a periodic signal, and the phase detector compares the phase of that signal with the phase of the input periodic signal, adjusting the oscillator to keep the phases matched. Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for computer clock synchronization, demodulation, and frequency synthesis.

In the other examples, the delay-locked-loop (DLL) can be a digital circuit similar to a phase-locked loop (PLL), with the main difference being the absence of an internal voltage-controlled oscillator, replaced by a delay line. A DLL can be used to change the phase of a clock signal (a signal with a periodic waveform), usually to enhance the clock rise-to-data output valid timing characteristics of integrated circuits (such as DRAM devices). DLLs can also be used for clock recovery (CDR). From the outside, a DLL can be seen as a negative-delay gate placed in the clock path of a digital circuit. The main component of a DLL can be a delay chain composed of many delay gates connected output-to-input. The input of the chain (and thus of the DLL) is connected to the clock that is to be negatively delayed. A multiplexer can be connected to each stage of the delay chain and the selector of this multiplexer can be automatically updated by a control circuit to produce the negative delay effect. The output of the DLL can be the resulting, negatively delayed clock signal.

Phase-locked loops can be widely employed in radio, telecommunications, computers, and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can now provide a complete phase-locked-loop building block, the technique can be widely used in modern electronic devices, with output frequencies from a fraction of a hertz up to many gigahertz. Further, while phase-locked-loops (PLLs) and delay-locked-loops (DLLs) are provided in these examples, embodiments are not so limited. For example, any circuit capable of generating the clock or changes in frequency can be used.

In the instance of DC (stuck-at) testing, the clock control component 128 can ensure that only one clock pulse is generated in the capture phase. Similarly, during AC (at-speed) testing, the clock control component 128 ensures two or more clock pulses are generated in the capture phase, having a frequency equal to the frequency of the functional clock. Therefore, test clocks used in a scan design can be routed through the clock control component 128, which controls the clock operation in the scan mode (both in stuck-at and at-speed testing) and bypasses the functional clock in a functional mode.

Generally, an AC scan is configured to detect an at-speed fault and a DC scan is configured to detect a stuck-on fault. An AC scan detects manufacturing defects that behave as delays on gate input-output ports. So, in an AC scan, each port is tested for logic 0-to-1 transition delay (slow-to-rise fault) or logic 1-to-0 transition delay (slow-to-fall fault). Like stuck-at faults, the at-speed fault can be at the input or output of a gate, thus a simple 2-input AND gate has six possible at-speed faults. As an example, suppose a slow-to-fall fault is occurring at the output of an AND gate. A slower 1-to-0 transition at the output of the AND gate may occur and can affect the value captured. It is important to note that only with an initial state '1' in a flop and 010 at the input will the at-speed fault be able to be detected.

Referring back to the DC (stuck-at) scan, the DC scan models manufacturing defects which occur when a circuit node is shorted to a positive supply voltage or "VDD" (stuck-at-1 fault) or a ground voltage "GND" (stuck-at-0 fault) permanently. The fault can be at the input or output of a gate. Thus, a simple 2-input AND gate has six possible stuck-at faults. As an example, suppose a stuck-at-0 fault is at the output of an AND gate. Note one important thing for this example, there are three input ports in the circuit, thus, there can be a combination of eight different inputs or patterns {000, 001, 010, 011, 100, 101, 110, 111}; out of the eight patterns, only one pattern {011} will be able to detect this fault. As with the rest of the patterns, the expected output can be the same as the actual circuit output in the presence of this stuck-at-0 fault. As this is a small circuit in this example, the pattern can be easily found that detects this fault. However, more complicated circuits will use more complicated stuck-at-0 fault patterns to test all the possible fault locations using complex steps and are contemplated withing the scope of the disclosure.

Further, in this example illustrated in FIG. 1, the ATE component 120 can be in communication with the power management controller 124 through a one-time-programmable ("OTP") memory 116. However, embodiments are not so limited and the power management controller 124 can be in communication with the ATE component 120 through other methods or components capable of such communication. For example, a programmable component that is not a one-time programmable component, such as a memory that can be programmed multiple times or more than once, can be used. A one-time-programmable memory (OTP) can refer to a particular type of non-volatile memory (NVM) that permits data to be written to memory only once. Once the memory has been programmed, it retains its value upon loss of power (i.e., is non-volatile). OTP memory can be used in applications where reliable and repeatable reading of data is required. Examples include boot code, encryption keys, and configuration parameters for analog, sensor, or display circuitry. OTP NVM is characterized, over other types of NVM like electronic fuse (eFuse) or electrically-erasable programmable read only memory (EEPROM), by offering a low power, small area footprint memory structure. As such, OTP memory can be used in microprocessors, display drivers, and Power Management ICs (PMICs).

The OTP 116 can include a voltage-frequency-temperature table ("VFT") 132. The VFT 132 can be a group of cells used to store data related to performance of an AC scan operation and/or data related to performance of a memory built-in self-test (MBIST) operation. As an example, the AC scan can be performed by the AC scan controller 114 and the data generated from the AC scan and associated with parameters such as voltage (V), frequency (F), temperature (T), etc., and can be stored in the VFT table 132. The stored data in the VFT table 132 can be used to determine a particular frequency and/or voltage to use in the SoC 110 based on a number of error rates and/or quantity of errors that occur at a particular frequency and/or voltage. While, in some embodiments, an AC scan can occur at a time of manufacturing and prior to use by a user, an AC scan can be performed at different time periods or time points throughout a life cycle of the system 101 and/or SoC 110. For example, at a particular period of time post-manufacturing or post-use by the user, an AC scan can be performed at boot-up of the SoC 110. The data associated with the frequency and/or voltage and corresponding error rates and/or error quantities may have changed from the initial AC scan or several initial AC scans associated with a time of manufacturing. This can be due to effects of age on the memory cells that can cause the frequency, voltage, and/or temperatures to alter the efficacy and/or accuracy of data stored in the memory cells over time. Accordingly, adjusted data based on such post-manufacturing scans can be stored in a register and/or in a particular memory location within the SoC 110 and can be used to modify how the VFT table 132 is being used to adjust the voltage and/or frequency values of the SoC 110.

Further, a temperature sensor 118 can be in communication with the power management controller 124 and can provide temperature data to the power management controller 124. The temperature sensor 118 can be embedded within the SoC 110 and can provide a temperature value at a number of different locations within the SoC 110. For example, the temperature sensor 118 can be embedded near a power transistor(s) that is near a heat source of the SoC 110. While one temperature sensor 118 is described, embodiments are not so limited. As an example, any number of temperature sensors can be located throughout the SoC 110, such as close to specific heat-dissipating transistors, near the power supply 126, etc.

In some embodiments, the system 101 can be deployed on, or otherwise included in a memory system (e.g., a storage device, a memory module, or a hybrid of a storage device and memory module). Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

In other embodiments, the system 101 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Such computing devices can include a host system that is coupled to a memory system (e.g., one or more storage devices, memory modules, or a hybrid of a storage device and memory module). A host system can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system uses the storage device, the memory module, or a hybrid of the storage device and the memory module, for example, to write data to the storage device, the memory module, or the hybrid of a storage device and memory module and read data from the storage device, the memory module, or the hybrid of a storage device and memory module.

In these examples, the host system can include a processing unit such as a central processing unit (CPU) that is configured to execute an operating system. In some embodiments, the processing unit can execute a complex instruction set computer architecture, such an x86 or other architecture suitable for use as a CPU for a host system.

A host system can be coupled to a memory system via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system and the memory system. The host system can further utilize an NVM Express (NVMe) interface to access components when the memory system is coupled with the host system by the PCIe interface. The physical host interface can provide an interface for passing control, address, data, and other signals between the memory system and the host system. In general, the host system can access multiple memory sub-systems via a same communication connection, multiple separate communication connections, and/or a combination of communication connections.

A memory system can include any combination of the different types of non-volatile memory devices and/or volatile memory devices. The volatile memory devices can be, but are not limited to, random access memory (RAM), such as dynamic random-access memory (DRAM) and synchronous dynamic random access memory (SDRAM).

Some examples of non-volatile memory devices include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as three-dimensional cross-point arrays of non-volatile memory cells and NAND type memory (e.g., 2D NAND, 3D NAND) are described, the memory device can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative- or (NOR) flash memory, and electrically erasable programmable read-only memory (EEPROM).

A memory system can also include additional circuitry or components. In some embodiments, a memory system can include a cache or buffer (e.g., DRAM) and address circuitry (e.g., a row decoder and a column decoder) that can receive an address from the memory system controller and decode the address to access the memory device(s).

In some embodiments, memory devices can include local media controllers that operate in conjunction with a memory system controller to execute operations on one or more memory cells of the memory devices. For example, an external controller can externally manage the memory device (e.g., perform media management operations on the memory device). In some embodiments, a memory device is a managed memory device, which is a raw memory device combined with a local controller for media management within the same memory device package. An example of a managed memory device is a managed NAND (MNAND) device.

Figure 2:
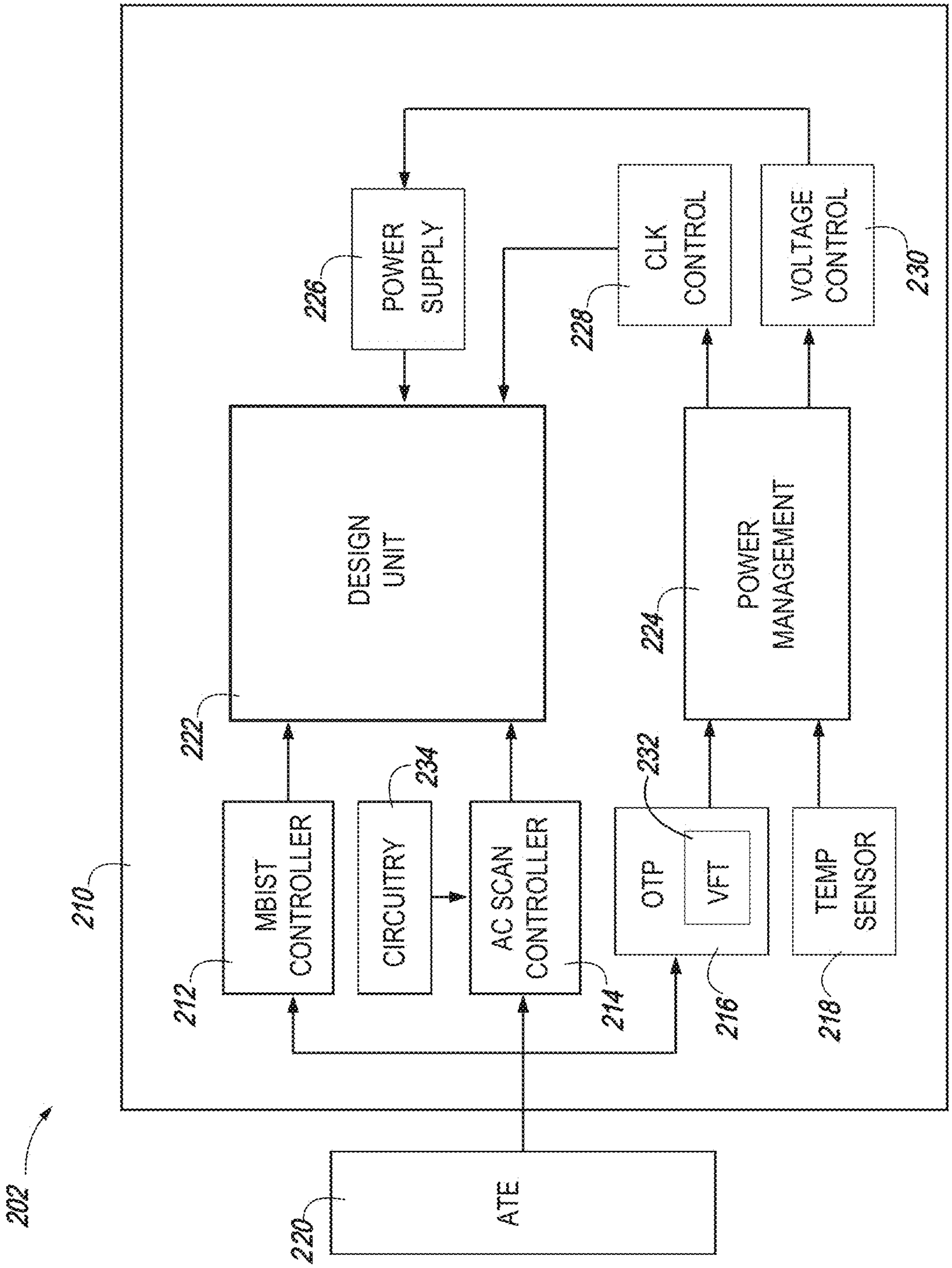
FIG. 2 illustrates an example system for scan-based voltage frequency scaling in accordance with some embodiments of the present disclosure.

FIG. 2 illustrates an example system 202 for scan-based voltage frequency scaling in accordance with some embodiments of the present disclosure. Similar to FIG. 1, FIG. 2 can include the same and/or similar components. For example, FIG. 2 illustrates an ATE 220 that is similar to ATE 120 in FIG. 1 and a system-on-chip (SoC) 210 similar to SoC 110 in FIG. 1. The SoC 210 can include a design unit 222 that is in communication with the ATE 220 through an MBIST controller 212 and an AC scan controller 214. The SoC 210 can also include a power management controller 224 that is in communication with the ATE 220 through an OTP 216 and in communication with the design unit 222 through a clock control component 228, a voltage control component 230 and a power supply 226. A temperature sensor 218 may be in communication with the power management controller 224.

However, a distinction from FIG. 1 that is illustrated in FIG. 2 is circuitry 234 in communication with the AC scan controller 214. The circuitry 234 can be, for example, circuitry associated with a non-volatile memory device such as, in some examples, a NAND flash memory array. As an additional example, memory array 202 can be a storage class memory (SCM) array, such as, for instance, a three-dimensional cross-point (3D Cross-point) memory array, a ferroelectric RAM (FRAM) array, or a resistance variable memory array such as a PCRAM, RRAM, or spin torque transfer (STT) array, among others. The circuitry 234 can be used to store additional data received during an AC scan. For example, an AC scan performed during a lifecycle of the SoC 110, as described above, can provide additional voltage, frequency, temperature, and/or error data that can be stored in the circuitry 234. As an example, the OTP 216 may be prevented from being written to (as it is a one-time-programmable memory and may have already been written to initially). In this instance, the stored AC scan data can be accessed in order to modify an analysis of the scan data already stored in the voltage-frequency-temperature (VFT) table 232 in the OTP 216. The VFT table 232 storing the scan data can be adjusted based on the additional scan data stored in the circuitry 234 in order to modify a frequency and/or a voltage and minimize and/or attempt to avoid a number of errors in the SoC 210.

Figure 3:
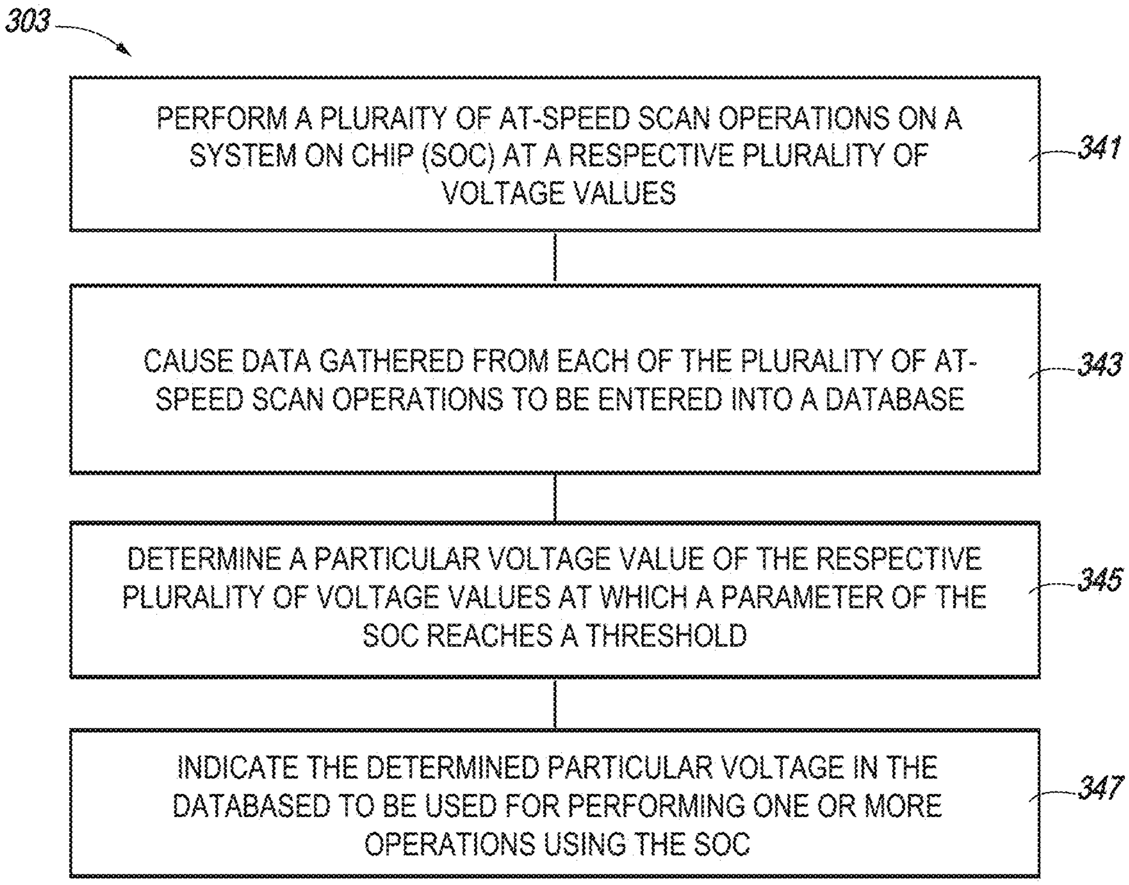
FIG. 3 illustrates an example method for adjusting a voltage value for scan-based voltage frequency scaling in accordance with some embodiments of the present disclosure.

FIG. 3 illustrates an example method 303 for adjusting a voltage value for scan-based voltage frequency scaling in accordance with some embodiments of the present disclosure. The method 303 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 303 is performed by one or more components of the system 101 of FIG. 1 and/or one or more components of the system 202 in FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 341, a plurality of at-speed scan operations can be performed on a system on chip (SoC) at a respective plurality of voltage values. For example, a first at-speed scan of the plurality of at-speed scan operations can be performed at a first voltage value of the plurality of voltage values, a second at-speed scan of the plurality of at-speed scan operations can be performed at a second voltage value of the plurality of voltage values, a third at-speed scan operation of the plurality of at-speed scan operations can be performed at a third voltage value of the plurality of voltage values, etc. The second and third at-speed scan operations can be performed at the second and third voltage values subsequent to performing the first at-speed scan operation at the first voltage value, and so forth. In some examples, at least one of the plurality of at-speed scan operations can be performed during a boot operation of the SoC.

As used herein, at least one of the plurality of at-speed (AC) scan operations is used to detect an at-speed fault. An at-speed (AC) scan operation detects manufacturing defects that behave as delays on gate input-output ports. So, in an at-speed (AC) scan, each port is tested for logic 0-to-1 transition delay (slow-to-rise fault) or logic 1-to-0 transition delay (slow-to-fall fault). Like stuck-at faults, the at-speed fault can be at the input or output of a gate, thus a simple 2-input AND gate has six possible at-speed faults. As an example, suppose a slow-to-fall fault is occurring at the output of an AND gate. A slower 1-to-0 transition at the output of the AND gate may occur and can affect the value captured. It is important to note that only with an initial state '1' in a flop and 010 at the input will the at-speed fault be able to be detected.

At operation 343, data gathered from each of the plurality of at-speed scan operations can be caused to be entered into a database (e.g., a table). In some examples, the database can be a voltage-frequency-temperature (VFT) table. The entered data from each of the plurality of at-speed scan operations can be associated with each of the respective plurality of voltage values. For example, data gathered while performing the first at-speed scan operation while the voltage value was at the first voltage value can be stored in the VFT table to be associated with the first voltage value. The data gathered can include a particular frequency value corresponding to the first voltage value. The data gathered can include an error rate at the first voltage value, an error count value at the first voltage value, etc.

At operation 345, a particular voltage value of the plurality of voltage values at which a parameter of the SoC reaches a threshold can be determined. In some examples, the parameter is a total error count associated with the SoC. In some examples, the parameter can refer to an error rate, an error count, a frequency value, a voltage value, or a temperature value, etc. In some examples, the threshold is a threshold frequency value at which a particular quantity of errors are occurring or determined to occur with a particular probability. The particular quantity of errors may be determined to occur with a particular probability due to other factors being variable or changing either based on other parameters or based on aging of the components, etc. For example, the temperature may fluctuate based on other factors and the fluctuating temperature may affect the particular quantity of errors and be, therefore, based on a probability that correlates to what the temperature may be close to, or based on a probability that correlates to some other fluctuating variable.

At operation 347, the determined particular voltage can be indicated in the database (e.g., VFT table). The indicated determined particular voltage can be used for performing one or more operations using the SoC. For example, the one or more operations can be performed at the determined particular voltage using the SoC. Further, the database (e.g., VFT table) can be referenced in order to perform any one of the one or more operations at a particular voltage that correlates to the data that was gathered and that indicates an optimal voltage at which to operate the one or more operations. The determined particular voltage can be indicated by labeling or marking the determined particular voltage, by correlating or associating the determined particular voltage with another parameter or variable that indicates when to choose or select the determined particular voltage for performing operations on the SoC, etc.

In some examples, at least one of the plurality of at-speed scan operations is used to capture timing errors at an elevated frequency or a lowered voltage. In some examples, the method 303 can further include monitoring a temperature of the SoC and correlating the temperature to the particular voltage value. As an example, the particular voltage value can vary based on the temperature value. In some examples, the method 303 can include holding a frequency value constant while performing at least one of the plurality of at-speed scan operations at the respective plurality of voltage values. In some examples, the method 303 can include generating a graph based on the entered data gathered from the plurality of at-speed scan operations. In some examples, the method 303 can include using the graph to determine the particular voltage value. In summary, the method 303 illustrates how a plurality of at-speed scan operations can be used to determine which voltage frequency to operate a SoC for achieving a certain minimal or zero error rate or error count. The plurality of at-speed scan operations can gather data associated with any number of variables or parameters that may be important in determining a correlated error rate or error count.

Figure 4:
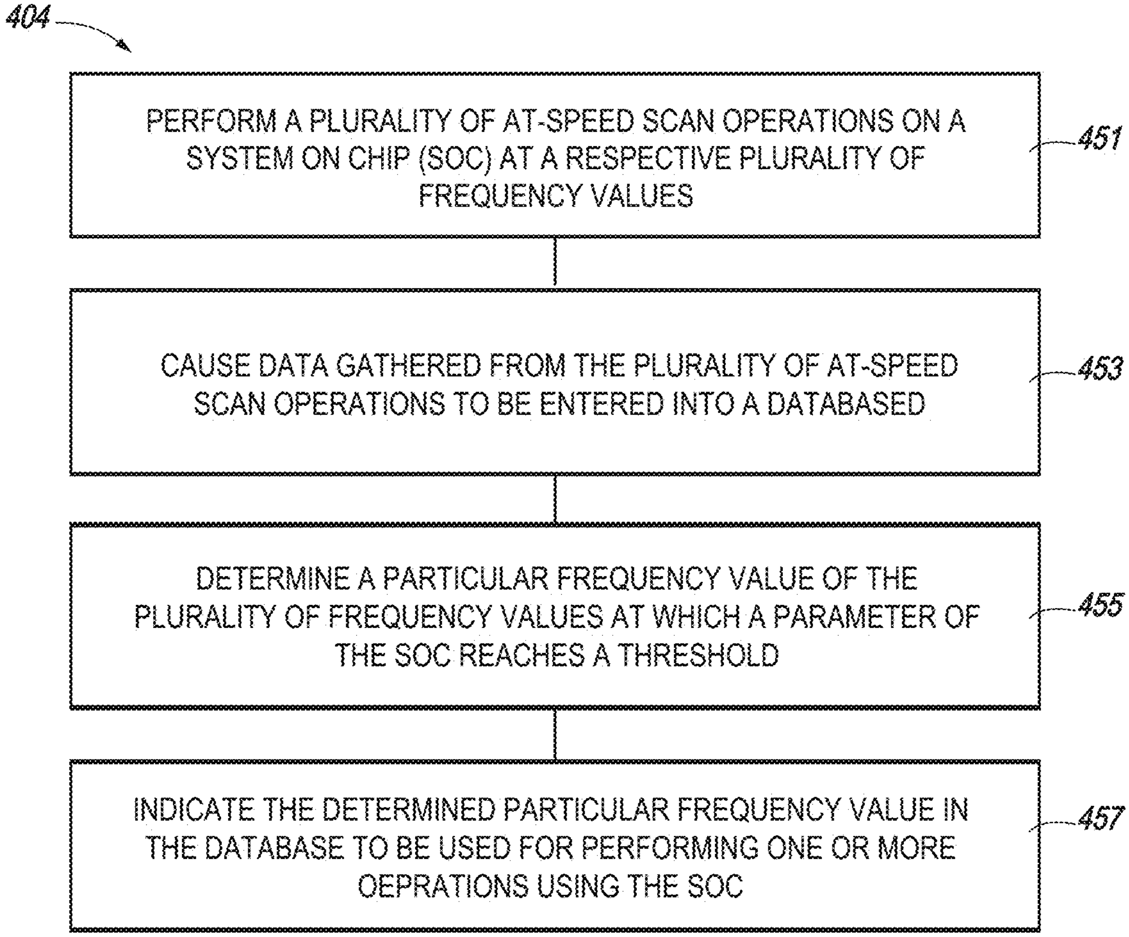
FIG. 4 illustrates an example method for adjusting a frequency value for scan-based voltage frequency scaling in accordance with some embodiments of the present disclosure.

FIG. 4 illustrates an example method 404 for adjusting a frequency value for scan-based voltage frequency scaling in accordance with some embodiments of the present disclosure. The method 404 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 404 is performed by one or more components of the system 101 of FIG. 1 and/or one or more components of the system 202 in FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 451, a plurality of at-speed scan operations can be performed on a system on chip (SoC) at a respective plurality of frequency values. In some examples, the plurality of at-speed scan operations performed on the SoC can be used to determine at-speed faults. In some examples, a voltage value is held constant while performing at least one of the plurality of at-speed scan operations at the plurality of frequency values.

At operation 453, data gathered from the plurality of at-speed scan operations can be caused to be entered into a database (e.g., a VFT table). The entered data is associated with the plurality of frequency values. For example, a first frequency value of the plurality of frequency values associated with performing a first at-speed scan operation of the plurality of at-speed scan operations can be entered into the database and be correlated with a first voltage value, a first temperature value, other SoC parameters, etc. A second frequency value of the plurality of frequency values associated with performing a second at-speed scan operation of the plurality of at-speed scan operations can be entered into the database and be correlated with a second voltage value, a second temperature value, other SoC parameters, etc., and so forth for additional frequency values used during the plurality of at-speed scan operations.

At operation 455, a particular frequency value of the plurality of frequency values at which a parameter of the SoC reaches a threshold can be determined. In some examples, the parameter can refer to a total error count associated with the SoC, an error rate associated with the SoC, or a corresponding voltage value, etc. In some examples, the threshold is a threshold voltage value at which a particular quantity of errors are occurring or are determined to occur with a particular probability. In some examples, the method 404 can further include monitoring a temperature of the SoC and correlating the temperature to the particular frequency value. As an example, the particular frequency value can vary based on the temperature value.

At operation 457, the determined particular frequency value can be indicated in the database (e.g., VFT table). The indicated determined particular frequency value can be used for performing one or more operations using the SoC. For example, the one or more operations can be performed at the determined particular frequency using the SoC. Further, the database (e.g., VFT table) can be referenced in order to perform any one of the one or more operations at a particular frequency that correlates to the data that was gathered and that indicates an optimal frequency at which to operate for the one or more operations. The determined particular frequency value can be indicated by labeling or marking the determined particular frequency value, by correlating or associating the determined particular frequency value with another parameter or variable that indicates when to choose or select the determined particular frequency value for performing operations on the SoC, etc. In some embodiments, the method 303 can include generating a graph based on the entered data gathered from the plurality of at-speed scan operations. In some embodiments, the method 3030 can include using the graph to determine the particular frequency value.

Figure 5:
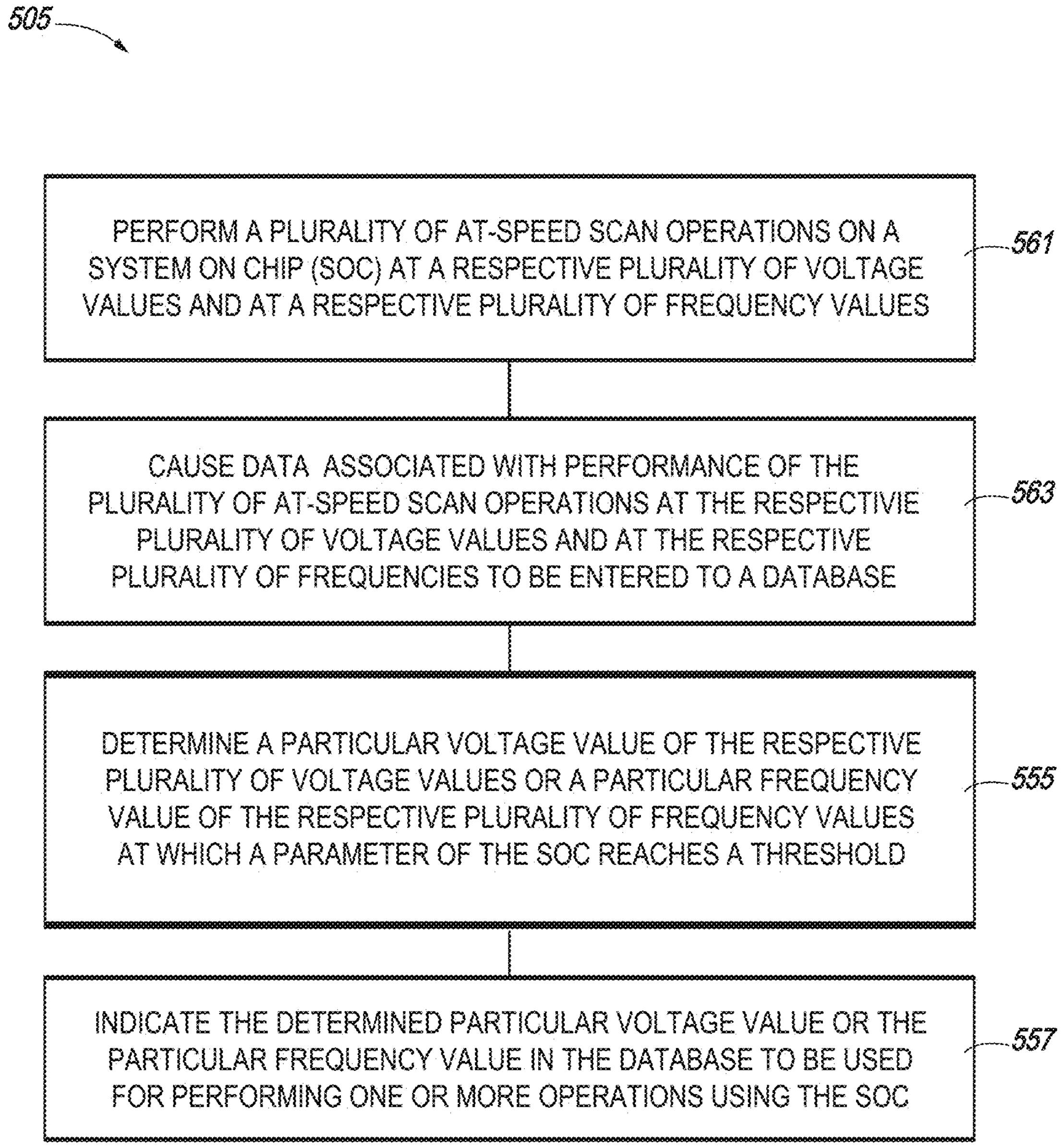
FIG. 5 illustrates an example method associated with adjusting a voltage value and/or a frequency value for scan-based voltage frequency scaling in accordance with some embodiments of the present disclosure.

FIG. 5 illustrates an example method 505 associated with adjusting a voltage value and/or a frequency value for scan-based voltage frequency scaling in accordance with some embodiments of the present disclosure. The method 505 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 505 is performed by one or more components of the system 101 of FIG. 1 and/or one or more components of the system 202 in FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 561, a plurality of at-speed scan operations can be performed on a system on chip (SoC) at a respective plurality of voltage values and at a respective plurality of frequency values. In some examples, a scan controller, such as AC scan controller 114 and 214 in FIGS. 1-4, respectively, can perform the plurality of at-speed scan operations. In some examples, the scan controller can perform the plurality of at-speed scan operations while decreasing a voltage value of the plurality of voltage values and increasing a frequency value of the plurality of frequency values. In some examples, a scan controller (e.g., an AC scan controller) can perform at least one of the plurality of at-speed scan operations during a boot operation of the SoC. In some examples, the scan controller can perform at least one of the plurality of at-speed scan operations at a plurality of time periods during operation of the SoC. For example, the at least one of the plurality of at-speed scan operations can be scheduled to be performed based on a particular time period schedule, such as every 6 months, every year, every 2 years, etc. Further, the at least one at-speed scan operation can be scheduled to be performed based on a number of memory accesses (read operations, write operations, etc.) in the SoC, a quantity of times a particular operation is performed in the SoC, etc. In this way, an effect of aging on the SoC components can be monitored and determined. In some examples, a portion of the plurality of at-speed scan operations can be performed while holding a voltage value constant and varying the plurality of frequencies. Further, a portion of the plurality of at-speed scan operations can be performed while holding a frequency value constant and varying the plurality of frequencies.

At operation 563, data associated with performance of the plurality of at-speed scan operations at the respective plurality of voltage values and at the respective plurality of frequencies can be caused to be entered to a database (e.g., a VFT table. The database (e.g., VFT table) can be within an OTP component, such as the VFT table 232 in FIGS. 1-2, respectively, being within OTP component 116 and 216 in FIGS. 1-2, respectively. While illustrated as being an OTP component, additional components such as programmable components that are able to be programmed more than once can also be used. A one-time-programmable (OTP) component can refer to a particular type of non-volatile memory (NVM) that permits data to be written to memory only once. Once the memory has been programmed, it retains its value upon loss of power (i.e., is non-volatile). OTP memory can be used in applications where reliable and repeatable reading of data is required. Examples include boot code, encryption keys, and configuration parameters for analog, sensor, or display circuitry.

At operation 565, a particular voltage value of the respective plurality of voltage values or a particular frequency value of the respective plurality of frequency values at which a parameter of the SoC reaches a threshold can be determined. A parameter can refer to a temperature value of the SoC, a voltage value, a frequency value, an error rate, an error count, etc. In some examples, the parameter is a total error count at each of the plurality of frequency values or at each of the plurality of voltage values. In some examples, the method 505 can further include monitoring a temperature of the SoC and correlating the temperature to the particular voltage value and/or to the particular frequency value. As an example, the particular voltage value and/or the particular frequency value can vary based on the temperature value.

At operation 567, the determined particular voltage value or the particular frequency value can be indicated in the database The indicated determined particular frequency value or the determined particular frequency value can be used for performing one or more operations using the SoC. For example, the one or more operations can be performed at the determined particular frequency and/or the determined particular voltage value using the SoC. Further, the database (e.g., VFT table) can be referenced in order to perform any one of the one or more operations at a particular frequency and/or particular voltage that correlates to the data that was gathered and that indicates an optimal frequency and/or optimal voltage at which to operate for the one or more operations. The determined particular voltage value or the determined particular frequency value can be indicated by labeling or marking the determined particular voltage value or the determined particular frequency value in the table. The determined particular voltage value or frequency value can be indicated by correlating or associating the determined particular voltage value or frequency value with another parameter or variable that indicates when to choose or select the determined particular voltage value or frequency value for performing operations on the SoC, etc.

In some examples, the method 505 can include monitoring a temperature of the SoC using a temperature sensor, such as temperature sensor 118 and 218 in FIGS. 1-2, respectively. In some examples, the method 505 can include adjusting a power supply to the SoC using a power management controller, such as power management controller 124 and 224 in FIGS. 1-2, respectively. In some examples, the method 505 can include storing the table in a NAND memory device, such as circuitry 234 in FIG. 2.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including solid state drives (SSDs), hard disk drives (HDDs), floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:

performing a plurality of at-speed fault detection scan operations of a system at a respective plurality of voltage values, wherein each of the plurality of at-speed fault detection scan operations captures timing errors at an elevated frequency value or a lowered voltage value, or both than scan operations performed not at-speed;

causing data gathered from each of the plurality of at-speed fault detection scan operations to be entered into a database;

determining a particular voltage value of the respective plurality of voltage values at which a parameter of the system reaches a threshold; and indicating the determined particular voltage value in the database to be used for performing one or more operations using the system.

2. The method of claim 1, wherein the system is a system on chip (SoC).

3. The method of claim 1, further comprising monitoring a temperature of the system and correlating the temperature to the particular voltage value.

4. The method of claim 1, wherein at least one of the plurality of at-speed fault detection scan operations is performed during a boot operation of the system.

5. The method of claim 1, wherein the parameter is a total error count associated with the system.

6. The method of claim 5, wherein the threshold is a threshold frequency value at which a particular quantity of errors are occurring or determined to occur with a particular probability.

7. The method of claim 1, wherein a frequency value is held constant while performing at least one of the plurality of at-speed fault detection scan operations at the respective plurality of voltage values.

8. The method of claim 1, further comprising generating a graph based on the entered data gathered from at least one of the plurality of at-speed fault detection scan operations, and using the graph to determine the particular voltage value.

9. The method of claim 1, wherein the system comprises a memory system coupled to automatic testing equipment (ATE).

10. An apparatus, comprising:

a memory component; and a scan controller coupled to the memory component and configured to:

perform a plurality of at-speed fault detection scan operations of a system at a respective plurality of frequency values, wherein each of the plurality of at-speed fault detection scan operations captures timing errors at an elevated frequency value, or a lowered voltage value, or both than scan operations performed not at-speed;

cause data gathered from the plurality of at-speed fault detection scan operations to be entered into a database;

determine a particular frequency value of the respective plurality of frequency values at which a parameter of the system reaches a threshold; and indicate the determined particular frequency value in the database to be used for performing one or more operations using the system.

11. The apparatus of claim 10, wherein at least one of the plurality of at-speed fault detection scan operations performed on the system is used to determine at-speed faults.

12. The apparatus of claim 10, wherein the threshold is an error quantity threshold.

13. The apparatus of claim 10, wherein the threshold is an error rate threshold.

14. The apparatus of claim 10, wherein a voltage value is held constant while performing at least one of the plurality of at-speed fault detection scan operations at the respective plurality of frequency values.

15. The apparatus of claim 10, wherein the memory component is a NAND memory component.

16. The apparatus of claim 15, wherein the scan controller and memory component are within a system on chip that is coupled to automatic testing equipment.

17. An apparatus, comprising:

a scan controller coupled to automatic testing equipment; and a database coupled to the scan controller, wherein the scan controller is configured to:

perform a plurality of at-speed fault detection scan operations of a system at a respective plurality of voltage values and at a respective plurality of frequency values, wherein each of the plurality of at-speed fault detection scan operations captures timing errors at an elevated frequency value, or a lowered voltage value, or both than scan operations performed not at-speed;

cause data to be entered to the database;

determine a particular voltage value of the respective plurality of voltage values, or a particular frequency value of the respective plurality of frequency values, or both at which a parameter of the system reaches an error threshold; and indicate the determined particular voltage value, or the particular frequency value, or both in the database to be used for performing one or more operations using the system.

18. The apparatus of claim 17, wherein the scan controller is configured to perform at least one of the plurality of at-speed fault detection scan operations while decreasing a voltage value of the respective plurality of voltage values and increasing a frequency value of the respective plurality of frequency values.

19. The apparatus of claim 17, wherein the apparatus further comprises:

a temperature sensor configured to monitor a temperature of the system; and a power management controller configured to adjust a power supply to the system.

20. The apparatus of claim 17, wherein the scan controller is configured to perform at least one of the plurality of at-speed fault detection scan operations during a boot operation of the system.

* * * * *